(12) United States Patent
Matthews, II et al.

(10) Patent No.: US 12,096,585 B1
(45) Date of Patent: Sep. 17, 2024

(54) BOLT ON POWER

(71) Applicant: Worksite Lighting LLC, Haltom City, TX (US)

(72) Inventors: William Matthews, II, Haltom City, TX (US); Tanner Remondet, Prairieville, LA (US)

( * ) Notice: Subject to any disclaimer, the term of this patent is extended or adjusted under 35 U.S.C. 154(b) by 0 days.

(21) Appl. No.: 18/442,059

(22) Filed: Feb. 14, 2024

(51) Int. Cl.
*H05K 7/14* (2006.01)
*B23K 9/10* (2006.01)

(52) U.S. Cl.
CPC ......... *H05K 7/1432* (2013.01); *B23K 9/1006* (2013.01)

(58) Field of Classification Search
CPC .............................. H05K 7/1432; B23K 9/1006
See application file for complete search history.

(56) References Cited

U.S. PATENT DOCUMENTS

| | | | |
|---|---|---|---|
| 5,353,216 A | 10/1994 | Ayers et al. | |
| 10,046,411 B2 * | 8/2018 | Dessart | H05K 7/14324 |
| 10,182,651 B2 | 1/2019 | Jost et al. | |
| 11,524,357 B2 * | 12/2022 | Dessart | B23K 9/323 |
| 11,766,734 B2 * | 9/2023 | Dessart | H05K 7/14324 |
| | | | 219/130.1 |
| 11,766,735 B2 * | 9/2023 | Dessart | B23K 37/02 |
| | | | 219/136 |
| 2006/0044766 A1 | 3/2006 | Hartel et al. | |
| 2007/0256995 A1 | 11/2007 | Tenreiro et al. | |
| 2014/0069906 A1 | 3/2014 | Dessart et al. | |
| 2015/0129568 A1 | 5/2015 | Miller | |
| 2015/0336197 A1 * | 11/2015 | DeLisio | B23K 9/1006 |
| | | | 219/133 |
| 2016/0136749 A1 * | 5/2016 | Lee | B23K 9/1006 |
| | | | 219/130.1 |
| 2017/0369087 A1 | 12/2017 | Dyson | |
| 2018/0358789 A1 | 12/2018 | Corbo et al. | |
| 2022/0200250 A1 * | 6/2022 | Brooks | G06F 1/189 |

FOREIGN PATENT DOCUMENTS

GB 2506131 3/2014

OTHER PUBLICATIONS

"LEX Products-Welding Rack 6Pk to Locking Receptacle-WR6A-7SM-FG26DZ6LD-R", webpage <https://iscsales.com/item/lex-products-welding-rack-6pk-to-locking-receptacle-wr6a-7sm-fg26dz6ld-r/> two pages retrieved from the Internet on Feb. 12, 2024.

(Continued)

*Primary Examiner* — Robert J Hoffberg
(74) *Attorney, Agent, or Firm* — Examiners Edge; Gary ONeill

(57) ABSTRACT

An interoperable power distribution apparatus and systems includes N power distribution base units having a first configuration as sequentially arranged along a first dimension and secured as removably attached, and a second configuration where each of the N power distribution base units are independently and removably attached to a surface of one of N welding machine support units having various first, second, or third orthogonal dimensions, the N power distribution base units interoperable between the N welding machine support units having varied first, second, or orthogonal third dimensions, wherein N is a positive natural number between 1 and 100.

20 Claims, 12 Drawing Sheets

(56) References Cited

OTHER PUBLICATIONS

"Welding machine six pack", webpage <https://www.worksitelighting.com/product/welding-machine-six-pack/>, two pages retrieved from the Internet on Feb. 12, 2024.

"Modular Welding Station" by Southwire distributed via NNC, webpage <https://nassaunationalcable.com/products/modular-welding-station-991f3f2-3>, two pages retrieved from the Internet on Feb. 12, 2024.

"Orbicar Trolley", webpage <https://www.orbimax.com.au/collections/trolleys/products/orbicar-trolley>, two pages retrieved from the Internet on Feb. 12, 2024.

"Invertec® V276 8-Pack Rack", webpage <https://www.lincolnelectric.com/en/products/k4869-2>, three pages retrieved from the Internet on Feb. 12, 2024.

"Trystar Welding Racks", webpage <https://www.trystar.com/product/welding-racks/>, two pages retrieved from the Internet on Feb. 12, 2024.

* cited by examiner

US 12,096,585 B1

BOLT ON POWER

RELATED APPLICATIONS

N/A.

STATEMENT OF GOVERNMENT INTEREST

N/A.

BACKGROUND

The industrial revolution ushered in a transition from a predominately agricultural economy which was substantially reliant upon manual processes and individualized human labor to a new era which began to harness the power of machines and coordinated labor to leverage production capacities. The industrial revolution further led to the development of factories and associated production lines to facilitate and orchestrate the man-machine cooperative efforts in a systematic manner. Many of the inventions of the twentieth century, including the automobile, the airplane, the personal computer, the television, and the mobile phone to name a few, are resultant from the discovery, development, and commercialization of industrial manufacturing technologies unleashed within modern factory environments.

Despite the undeniable beneficial impacts of these numerous technological advances, the modern era is nonetheless equally dependent on manufacturing and construction technologies that cannot be easily or completely performed within the confines of contemporary factory environments. Aviation, ship building, oil and gas drilling and development, and mining operations are exemplary of industries that demand the use of special manufacturing and construction techniques that, at least in some circumstances, are best performed outside of traditional factory-controlled environments. For example, there are a great number of industries that require welding operations on components and materials which are best performed outdoors, and often under sub-optimal working conditions. To address these needs, numerous equipment manufacturers have developed portable and relocatable welding machines and welding machine support structures which are capable of delivery, use, and removal from the various worksites and across whatever local geographic and environmental conditions are necessitated by the particular projects. While the various welding equipment manufacturers have facilitated the ability to perform specialized manufacturing and construction in situ, such as at a distant construction site, an unintended consequence of their achievements is that there is now a plethora of various types, designs, sizes, dimensions, and power requirements for the various welding equipment manufacturers products. As there is no standardized or universal design of welding equipment and associated support structures which are used by all of the various equipment manufacturers, the teams of personnel who are tasked to perform the specialized manufacturing and construction activities at the local or distant worksites are often hindered in selection of the most appropriate equipment needed to accomplish their work. This equipment selection process is compounded within the context of the high power, heavy weight, and high safety requirements of the types of equipment normally used for welding in harsh work environments.

SUMMARY OF THE INVENTION

The following provides a summary of certain exemplary embodiments of the present invention. This summary is not an extensive overview and is not intended to identify key or critical aspects or elements of the present invention or to delineate its scope. However, it is to be understood that the use of indefinite articles in the language used to describe and claim the present invention is not intended in any way to limit the described system. Rather the use of "a" or "an" should be interpreted to mean "at least one" or "one or more".

In accordance with one aspect of the present invention, an interoperable power distribution apparatus is provided. The interoperable power distribution apparatus includes a number N power distribution base units having a first configuration where the N power distribution base units are sequentially arranged along a first dimension such that the N power distribution base units when sequentially arranged along the first dimension are secured in sequence and removably attached. The N power distribution base units also have a second configuration wherein said N power distribution base units are not secured in sequence along at least a first dimension, and each of the N power distribution base units are independently and removably attached to at least one of a front, back, top, bottom or side surface of a respective one of N welding machine support units, each of the N welding machine support units have equal or unequal external first, second, or third orthogonal dimensions, the N power distribution base units are interoperable between the N welding machine support units having equal or unequal external first, second, or orthogonal third dimensions, when N is a positive natural number between 1 and 100.

In accordance with a second aspect of the present invention, the interoperable power distribution apparatus further includes a plurality of repositionable support brackets arranged along a surface of the N power distribution base units, the plurality of repositionable support brackets configured for positioning, movement, and secure repositioning of the plurality of repositionable support brackets for interoperability between the N welding machine support units constructed with equal or unequal external first, second, or third orthogonal dimensions to accommodate removable attachment to a variety of types of N welding machine support units.

In accordance with a third aspect of the present invention, the interoperable power distribution apparatus further includes one or more transformers electrically connectable to one or more power distribution blocks.

In accordance with a fourth aspect of the present invention, the interoperable power distribution apparatus further includes one or more removably attached light mast units each electrically connectable to one or more luminaires.

In accordance with a fifth aspect of the present invention, the interoperable power distribution apparatus further includes one or more magnetically attachable canopy lights.

In accordance with a sixth aspect of the present invention, the interoperable power distribution apparatus further includes one or more fork pockets configured to receive a plurality of forklift prongs.

In accordance with a seventh aspect of the present invention, the interoperable power distribution apparatus further includes one or more enclosure compartments configured for storage of at least one of cables, work tools, work materials, work parts, or work accessories.

In accordance with an eighth aspect of the present invention, the interoperable power distribution apparatus further includes a plurality of casters, rollers, or wheels.

In accordance with a ninth aspect of the present invention, the interoperable power distribution apparatus further includes a plurality of fastening regions for removable attachment of the N power distribution base units using components selected from apertures, pins, screws, bolts, clamps, nuts, and washers.

In accordance with a tenth aspect of the present invention, the interoperable power distribution apparatus further includes integrated, interconnecting electrical wiring wherein a plurality of N welding machine units, control boxes, power tools, luminaires, electrical receptacles, or other electrical devices are selectively powered using a unified electrical power input.

In accordance with a eleventh aspect of the present invention, an interoperable power distribution system includes a number N welding machine support units each including a frame structure configured to support N welding machine devices, the N welding machine support unit frame structures each further including a plurality of fastening regions for removable attachment of the frame structures to at least another frame structure, and additionally N power distribution base units have a first configuration wherein the N power distribution base units are sequentially arranged along at least a first dimension such that the N power distribution base units when sequentially arranged along the at least first dimension are secured in sequence and removably attached, and the N power distribution base units having a second configuration wherein the N power distribution base units are not secured in sequence along the at least a first dimension, each of the N power distribution base units are independently and removably attached to at least one of a front, back, top, bottom or side surface of a respective one of the N welding machine support units along at least one of the fastening regions, each of the N welding machine support units having equal or unequal external first, second, or third orthogonal dimensions, the N power distribution base units interoperable between the N welding machine support units having equal or unequal external first, second, or orthogonal third dimensions, wherein N is a positive natural number between 1 and 100.

In accordance with a twelfth aspect of the present invention, the interoperable power distribution system further includes a plurality of repositionable support brackets arranged along a surface of the N power distribution base units, the plurality of repositionable support brackets configured for positioning, movement, and secure repositioning of the plurality of repositionable support brackets for interoperability between the N welding machine support units constructed with equal or unequal external first, second, or third orthogonal dimensions to accommodate removable attachment to a variety of types of N welding machine support units.

In accordance with a thirteenth aspect of the present invention, the interoperable power distribution system includes a plurality of elongated beams and shelves arranged to support N welding machine devices.

In accordance with a fourteenth aspect of the present invention, the interoperable power distribution system further includes a plurality of fastening regions for removable attachment of the frame structures to at least another frame structure or at least one of the N power distribution base units, the fastening regions components including apertures, pins, screws, bolts, clamps, nuts, and/or washers.

In accordance with a fifteenth aspect of the present invention, the interoperable power distribution system further includes one or more transformers electrically connectable to one or more power distribution blocks.

In accordance with a sixteenth aspect of the present invention, the interoperable power distribution system further includes at least one of one or more removably attached light mast units each electrically connectable to one or more luminaires and one or more magnetically attachable canopy lights.

In accordance with a seventeenth aspect of the present invention, the interoperable power distribution system further includes one or more fork pockets configured to receive a plurality of forklift prongs.

In accordance with a eighteenth aspect of the present invention, the interoperable power distribution system further comprises one or more enclosure compartments configured for storage of at least one of cables, work tools, work materials, work parts, or work accessories.

In accordance with a nineteenth aspect of the present invention, the interoperable power distribution system further includes integrated, interconnecting electrical wiring wherein a plurality of N welding machine devices, control boxes, power tools, luminaires, electrical receptacles, or other electrical devices are selectively powered using a unified electrical power input.

In accordance with a twentieth aspect of the present invention, the interoperable power distribution system further includes one or more pigtail type connectors, one or more remote mounted outlet boxes, or both one or more pigtail type connectors and one or more remote mounted outlet boxes.

Additional features and aspects of the present invention will become apparent to those of ordinary skill in the art upon reading and understanding the following detailed description of the exemplary embodiments. As will be appreciated by the skilled artisan, further embodiments of the invention are possible without departing from the scope and spirit of the invention. Accordingly, the drawings and associated descriptions are to be regarded as illustrative and not restrictive in nature.

BRIEF DESCRIPTION OF DRAWINGS

The accompanying drawings, which are incorporated into and form a part of the specification, schematically illustrate one or more exemplary embodiments of the invention and, together with the general description given above and detailed description given below, serve to explain the principles of the invention, and wherein.

DETAILED DESCRIPTION

Figure 1:
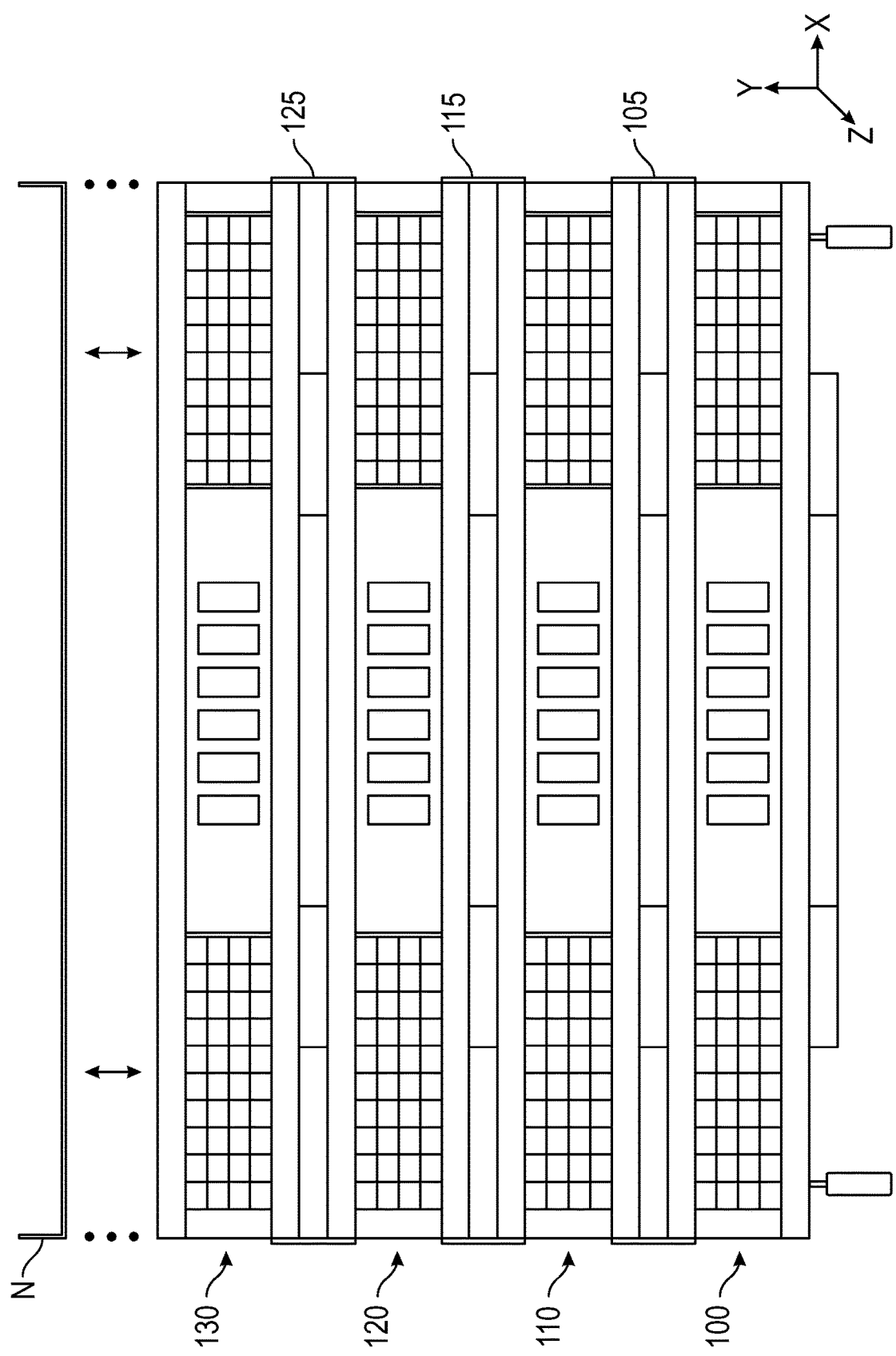
FIG. 1 is a perspective view of a plurality of power distribution base units in a first configuration in accordance with an exemplary embodiment of the present invention.

Exemplary embodiments of the present invention are now described with reference to the Figures. Reference numerals are used throughout the detailed description to refer to the various elements and structures. Although the following detailed description contains many specifics for the purposes of illustration, a person of ordinary skill in the art will appreciate that many variations and alterations to the following details are within the scope of the invention. Accordingly, the following embodiments of the invention are set forth without any loss of generality to, and without imposing limitations upon, the claimed invention.

As used herein, first, second, and third directions are mutually orthogonal and may include X, Y, and Z axis mutually orthogonal directions.

As used herein the term interoperable includes those qualities of an apparatus or systems which allow for universal connectivity between disparate apparatus and systems which would otherwise be in some aspect incompatible with one another, for example, whether such incompatibilities are essentially of a mechanical or an electrical nature.

Figure 5:
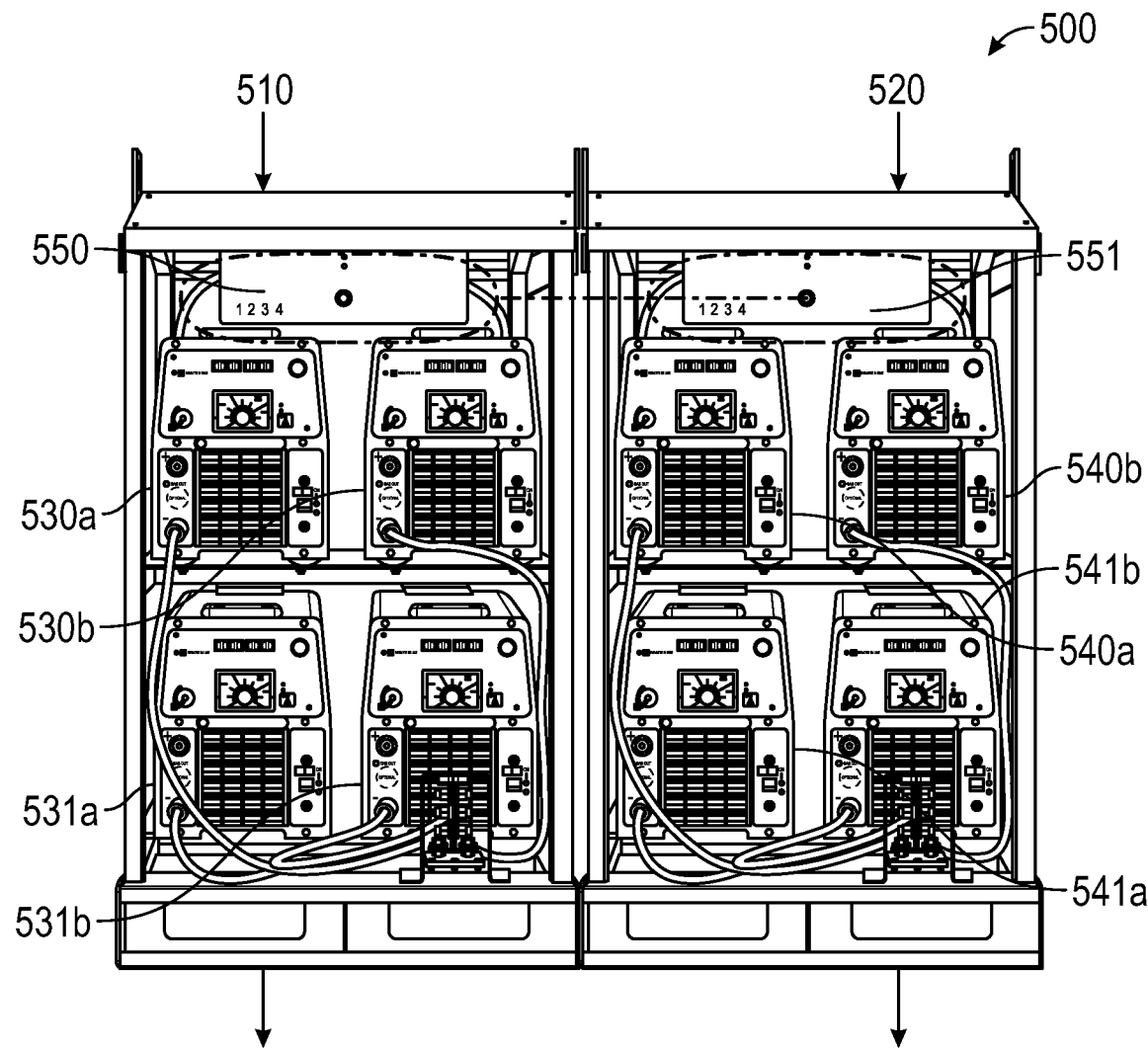
FIG. 5 is a perspective view of a conventional welding machine support unit for supporting prior art welding machines.

As best shown in FIG. 5, a pair of side-by-side prior art welding machine support units 500 include a first prior art welding machine support unit 510 and a second prior art welding machine support unit 520 are depicted. The first prior art welding machine support unit 510 includes at least upper and lower shelf areas, and as shown an upper shelf area supports a first welding machine 530a and a second welding machine 530b, while a lower shelf area supports a first welding machine 531a and a second welding machine 531b. Moreover, the second prior art welding machine support unit 520 includes at least upper and lower shelf areas, and as shown an upper shelf area supports a first welding machine 540a and a second welding machine 540b, while a lower shelf area supports a first welding machine 541a and a second welding machine 541b. The first prior art welding machine support unit 510 also includes a first welding rack control box 550, while the second prior art welding machine support unit 520 also includes a second welding rack control box 551. Each of the first welding rack control box 550 and the second welding rack control box 551 include various electrical control circuits which are configured to supply the design voltage, current, and power requirements to their respective welding machines 530a, 530b, 531a, 531b, 540a, 540b, 541a and 541b. In FIG. 5, the first prior art welding machine support unit 510 is a four-pack rack system and the second prior art welding machine support unit 520 is also a four-pack rack system, both four pack rack systems are commercially available from the same manufacturer, and thus are of comparable dimensions. The compatibility in electrical requirements, three-dimensional space requirements, and weight bearing requirements of each of these four pack rack systems when used together to support groups of welding machines supplied by a single manufacturer allows for convenient use by work crews engaged in welding and construction activities at worksites.

Figure 10:
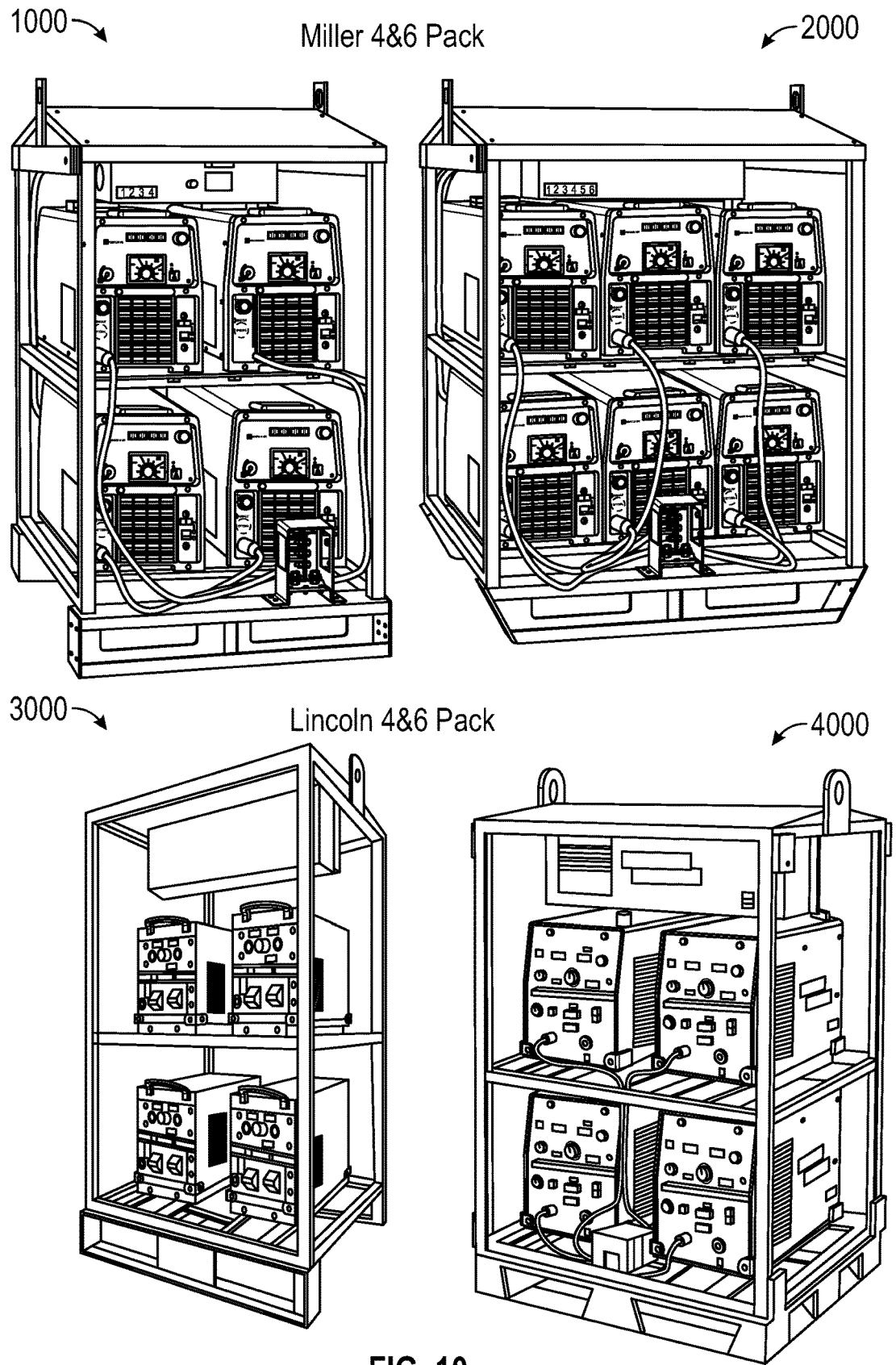
FIG. 10 is a perspective view of a plurality of conventional welding machine support units of various dimensions for supporting various prior art welding machine configurations.

FIG. 10 shows a first prior art welding machine support unit 1000 having a four-pack welding machine support capacity on upper and lower shelves and a second prior art welding machine support unit 2000, having a six-pack welding machine support capacity on upper and lower shelves. The first prior art welding machine support unit 1000 (which is essentially similar to welding machine support units 510 and 520), along with the supported four pack welding machines, and the second prior art welding machine support unit 2000, along with the supported six pack welding machines, are designed and supplied by a single vendor manufacturer A. Additionally, a third prior art welding machine support unit 3000 having a four pack welding machine support capacity on upper and lower shelves and a fourth prior art welding machine support unit 4000, having a four pack welding machine support capacity on upper and lower shelves is depicted. The third prior art welding machine support unit 3000, along with the supported four pack welding machines, and the fourth prior art welding machine support unit 4000, along with the supported four pack welding machines, are each designed and supplied by a single vendor manufacturer B. Although the first prior art welding machine support unit 1000, the third prior art welding machine support unit 3000 and the fourth prior art welding machine support unit 4000 are each designed to support four pack welding machines, it is apparent to those of ordinary skill in the art that the design topologies, including for example, the electrical requirements, the three dimensional space requirements, and the weight bearing requirements for each of these prior art welding machine support units as supplied and configured by two different known commercial manufacturers A and B, may be distinct and mutually incompatible in one or more of these requirements. In a similar way, it will be apparent to those of ordinary skill in the art that the design topologies of the second prior art welding machine support unit 2000 may be substantially divergent in electrical, dimensional, and weight bearing requirements, even though supplied and configured by known commercial manufacturer A to support six pack welding machines. Moreover, welding machine support units intended to support two pack, four pack, six pack, eight pack, or larger welding machine groupings may not be interoperable between the various sizes, electrical capacities, and weight bearing capacities available from a variety of commercial welding equipment manufacturers. It would be desirable to employ an interoperable power distribution apparatus and systems which may be safely configured for operability across various welding machine types, sizes, dimensions, and capacities, as well as associated arrays of welding machine support units produced by many different manufacturers of welding equipment.

FIG. 1 shows a perspective view of a plurality of interoperable power distribution base units including a first interoperable power distribution base unit 100, a second interoperable power distribution base unit 110, a third interoperable power distribution base unit 120, a fourth interoperable power distribution base unit 130, and further additional power distribution base units N, where N is a positive natural number between 1 and 100. As shown in FIG. 1, each of the plurality of interoperable power distribution base units labeled 100, 110, 120, 130, . . . N are arranged in a first configuration wherein said plurality of interoperable power distribution base units are sequentially arranged along at least a first dimension, such as a first vertical or Y dimension. A plurality of fastening regions 105, 115, 125, etc. are included at least along a portion of opposing ends of the plurality of interoperable power distribution base units 100, 110, 120, 130, . . . N, such that opposing pairs of said plurality of fastening regions 105, 115, 125, etc. are arranged along a second dimension, such as a second horizontal or X dimension as viewed from one perspective, and adjacent pairs of said plurality of fastening regions 105, 115, 125, etc. are further arranged along the first vertical or Y dimension, when viewed from another perspective. The plurality of fastening regions 105, 115, 125, etc. may include various combinations of components selected from the group consisting of apertures, pins, screws, bolts, clamps, nuts, washers and other connectors as are known in the art, and may further include male and female mating and various thread patterns to allow rapid, sufficiently rigid, and structurally sound interconnections and disconnection of attached components such as the plurality of interoperable power distribution base units 100, 110, 120, 130, . . . N. When the plurality of interoperable power distribution base units 100, 110, 120, 130, . . . N are arranged and interconnected along the plurality of fastening regions 105, 115, 125, etc. as shown in the first configuration depicted in FIG. 1, said plurality of interoperable power distribution base units 100, 110, 120, 130, . . . N are thus removably attached in the first configuration for convenient storage, shipping, or staging at a work site.

Figure 2:
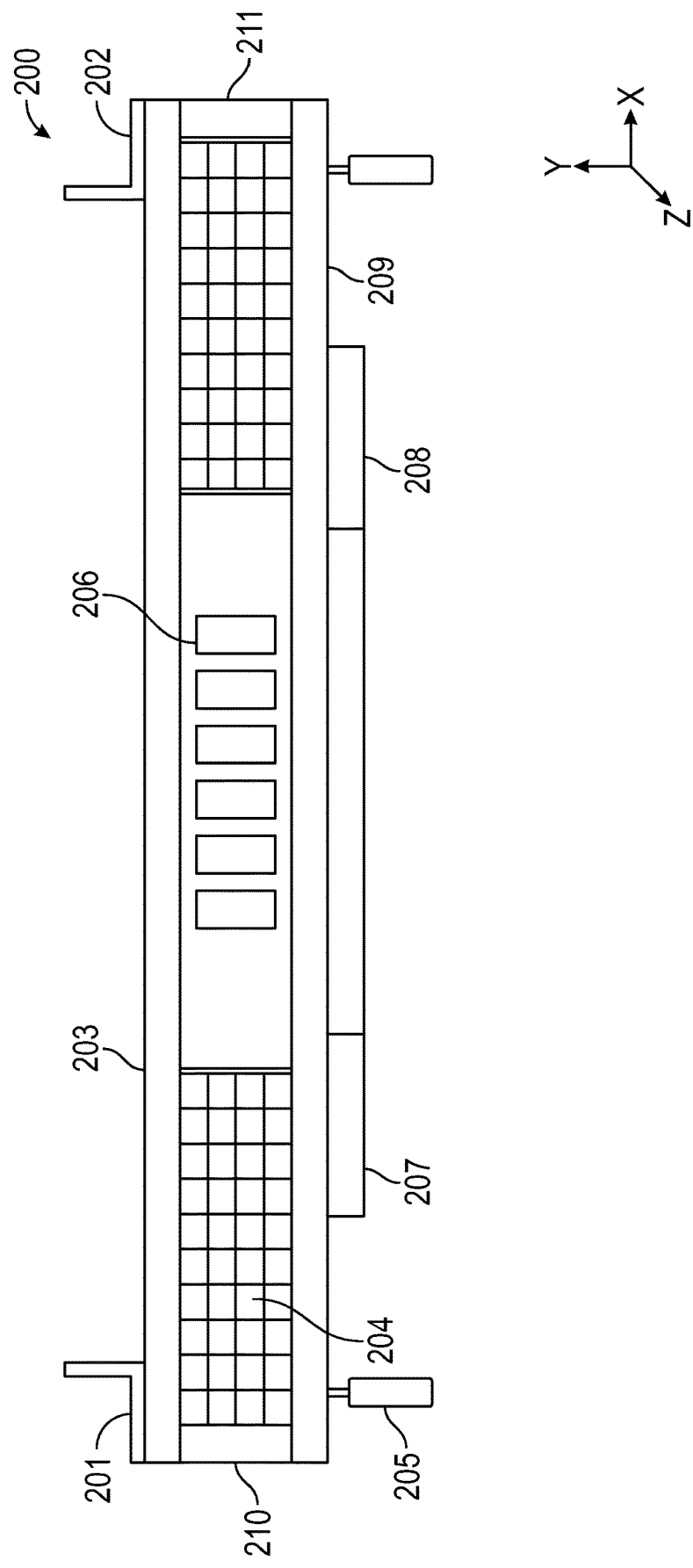
FIG. 2 is a perspective view of a power distribution base unit in accordance with an exemplary embodiment of the present invention.

FIG. 2 is a perspective view of a power distribution base unit 200 in accordance with an exemplary embodiment of the present invention. The exemplary power distribution base unit 200 may be used as any one of the plurality of interoperable power distribution base units 100, 110, 120, 130, . . . N. The power distribution base unit 200 includes an upper horizontal planar surface 203 extending along an X axis and Z axis directions upon which a plurality of repositionable support brackets 201 and 202 as shown are mounted along opposing edges of the upper horizontal planar surface 203, said plurality of repositionable support brackets 201 and 202 extend in part along orthogonal X, Y, and Z axis directions. Moreover, the plurality of repositionable support brackets 201 and 202 are securely and also removably attached to the upper horizontal planar surface 203 of the power distribution base unit 200 using various combinations of connection components consisting of apertures, pins, screws, bolts, clamps, nuts, washers and other connectors as are known in the art and may further include male and female mating and various thread patterns. The removeable attachment of the plurality of repositionable support brackets 201 and 202 allows the plurality of repositionable support brackets 201 and 202 to be positioned, moved, and then securely repositioned by loosening, removing, and/or reattaching the various combinations of connection components for moveability and positioning in a positive or negative X axis directions along the upper horizontal planar surface 203 of the power distribution base unit 200. As such, the plurality of repositionable support brackets 201 and 202 may be positioned and then secured to accommodate the base dimensions and weight bearing capacities of welding machine support units (e.g., 1000-4000 in FIG. 10) constructed with equal or unequal external first, second, or third orthogonal dimensions by adjusting the distances between the repositionable support brackets 201 and 202 to allow secure attachment via the connection components to welding machine support units produced by many different manufacturers of welding equipment. The power distribution base unit 200 is thus an interoperable power distribution apparatus which forms a part of an interoperable power distribution system which may be safely configured for operability across various welding machine types, sizes, dimensions, and capacities, as well as associated arrays of welding machine support units produced by many different manufacturers of welding equipment, said interoperability including at least mechanical interoperability and electrical interoperability, as further explained below.

Referring again to FIG. 2, the power distribution base unit 200 further includes screen portions 204, for example steel screens which may be formed as a grille to allow for easy visual identification of tools and accessories, as well as for proper ventilation and safe usage of high-powered welding equipment in close proximity which may operate at increased temperatures. The power distribution base unit 200 further includes a plurality of casters, rollers, or wheels 205 which are constructed for sufficient weight bearing capacity to provide rolling mobility for the power distribution base unit 200 even when loaded with numerous welding machines (e.g., two pack, four pack, six pack, eight pack, etc.) installed on welding machine support units (e.g., 1000-4000 in FIG. 10). A plurality of electrical receptacles 206 are mounted on a face of the power distribution base unit 200 for convenient electrical connections as needed for electrical energy supply to power tools and other electrically powered devices. As the power distribution base unit 200 is designed with high weight bearing capacity to support welding machines packed onto welding machine support units, fork lift prong pockets 207 and 208 are installed along a lower horizontal planar surface 209 extending along an X axis and Z axis directions to allow the power distribution base unit 200 to be safely lifted by insertion of fork lift prongs below the lower horizontal planar surface 209 of the power distribution base unit 200 such that the entire stacked structure including welding machines, welding machine support units, and the power distribution base unit 200 may be raised by a fork lift operator. Moreover, opposing end face surfaces 210 and 211 of the power distribution base unit 200 may include a plurality of fastening regions which may be used for secure and removable attachment of a plurality of power distribution base units 200 via combinations of various connector components as described above, when said plurality of power distribution base units 200 are arranged end to end along a second horizontal or X dimension.

Figure 2A:
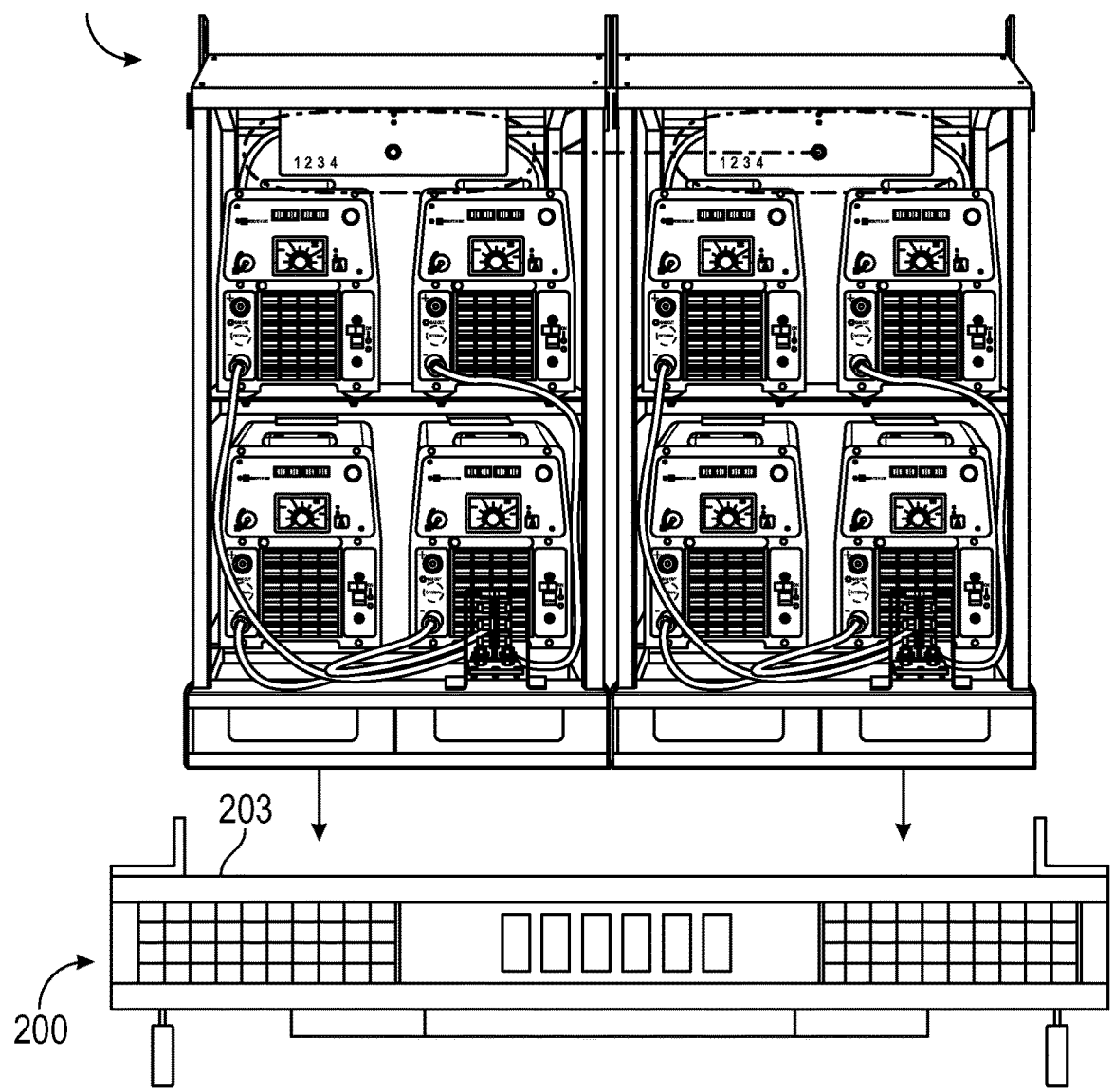
FIG. 2A is a perspective view of a power distribution base unit in a second configuration in accordance with an exemplary embodiment of the present invention.
Figure 2B:
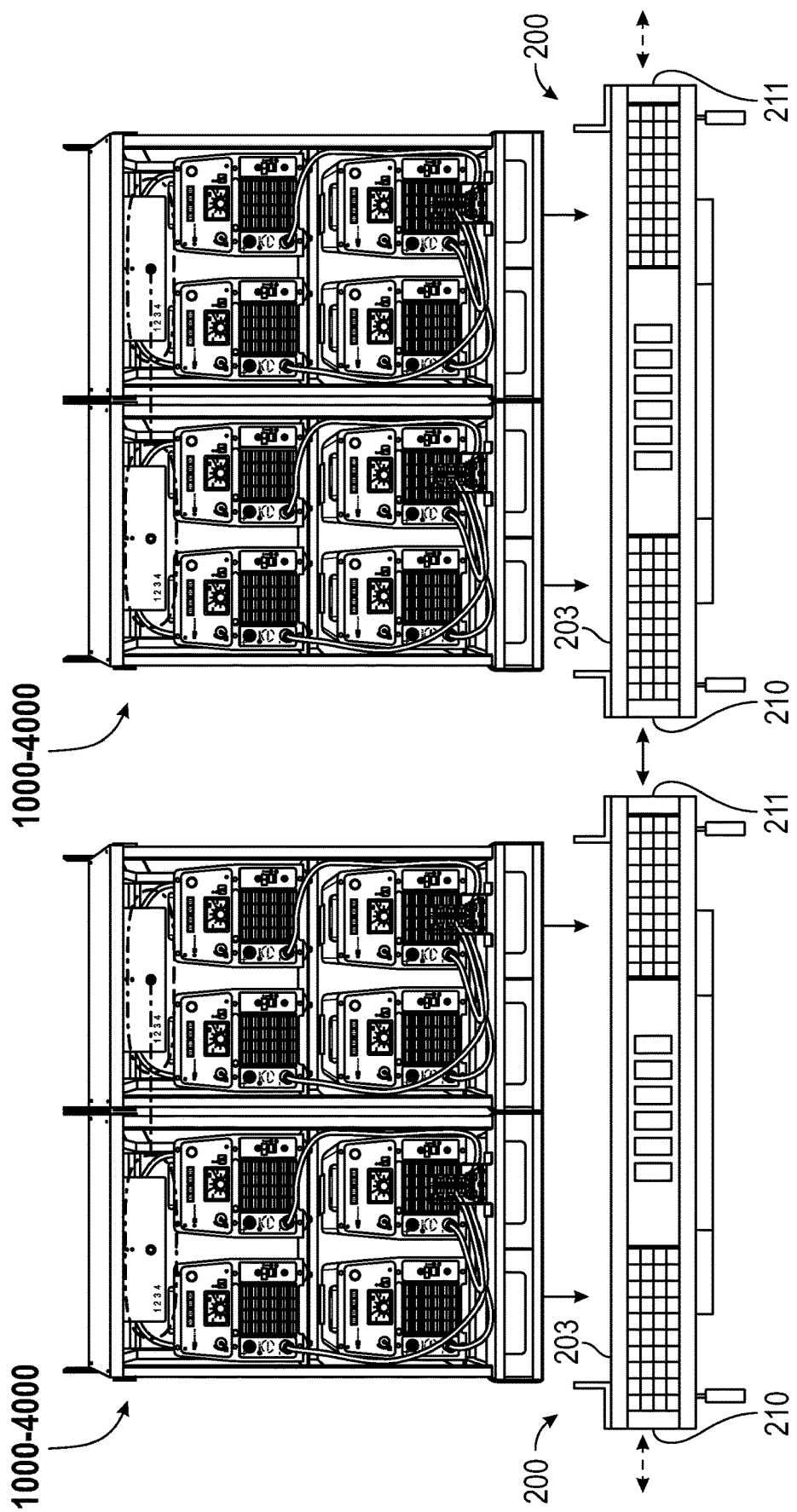
FIG. 2B is a perspective view of a plurality of power distribution base units in a second configuration in accordance with an exemplary embodiment of the present invention.

FIGS. 2A and 2B show perspective views of a power distribution base unit 200 and a plurality of power distribution base units 200, respectively, wherein said power distribution base units 200 are arranged according to a second configuration in accordance with an exemplary embodiment of the present invention. In said second configuration as shown in the exemplary embodiments of FIGS. 2A and 2B, one, two or any number N (where N is a positive natural number between 1 and 100) of power distribution base units 200 are independently and removably attached along at least an upper horizontal planar surface 203 of the respective power distribution base unit 200 to a respective one of N conventional welding machine support units, such as 1000-4000 in FIG. 10. Although attachment along an upper horizontal surface of the power distribution base unit 200 to a respective one of N conventional welding machine support units 1000-4000 is illustrated in exemplary embodiments as shown in FIGS. 2A and 2B, the attachment surfaces of said power distribution base unit 200 and said respective one of N conventional welding machine support units 1000-4000 may be along any appropriate mate able surfaces including at least respective front, back, top, bottom, or any left side or right side mount surfaces, wherein different attachment surface selections allow maximum flexibility in variable configurations which are adaptable as needed to suit particular installation requirements, available clearance space, weight balancing limitations, etc. to achieve broad interoperability as needed for specific applications. Each of the N welding machine support units 1000-4000 may support arrays of two pack, four pack, six pack, eight pack or more welding machines which may be produced by many different manufacturers of welding equipment, thus supporting various prior art welding machine types, sizes, dimensions, and capacities. Therefore when arranged according to the second configuration, the one or plurality of power distribution base units 200 are independently and removably attached to a respective one of N conventional welding machine support units each of which welding machine support units have varied equal or unequal external first, second, or third orthogonal dimensions according to their respective manufacturers design requirements for each specific welding machine array type and size, wherein said N power distribution base units 200 are thus at least mechanically interoperable and removably attachable between said N conventional welding machine support units having equal or unequal external first, second, or orthogonal third dimensions, when N is a positive natural number between 1 and 100. When the interoperable power distribution apparatus is arranged in this second configuration, workers may removably attach N conventional welding machine support units supporting various prior art welding machine arrays, types, sizes, dimensions, and capacities from many different manufacturers of welding equipment into an integrated interoperable power distribution system which permits safe, cost-effective combinations of desired sizes and choice of manufacturers for optimal selections of welding machines installed on welding machine support units as most appropriate for particular projects and tasks. The interoperable power distribution apparatus and system thus eliminates incompatibilities between differing manufacturers of welding machines and welding machines supports.

Figure 3:
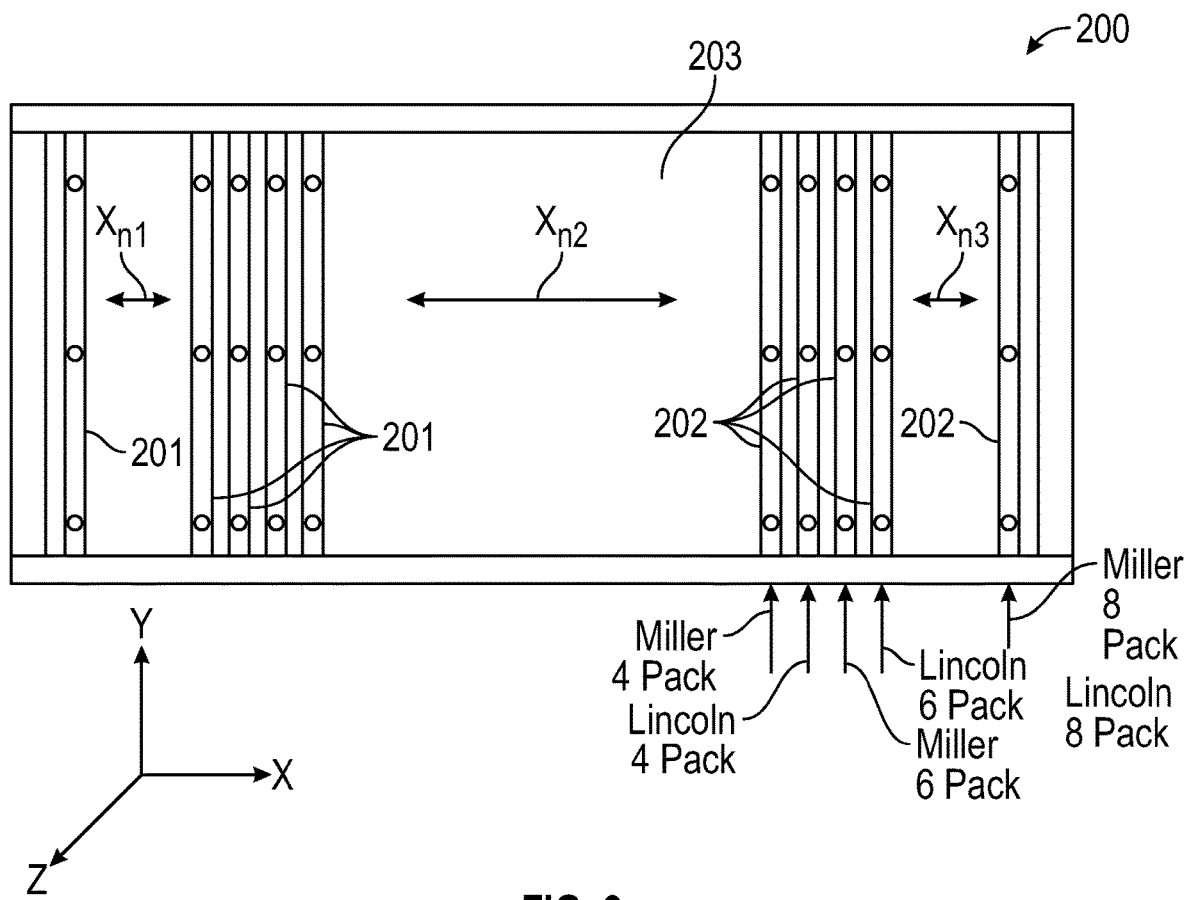
FIG. 3 is a top view of the power distribution base unit shown in FIG. 2 in accordance with an embodiment of the present invention.

FIG. 3 is a top view of the power distribution base unit 200 shown in FIG. 2 in greater detail in accordance with an embodiment of the present invention. FIG. 3 shows an upper horizontal planar surface 203 of the power distribution base unit 200 upon which a plurality of repositionable support brackets 201 and 202 are movably mounted.

Figure 4:
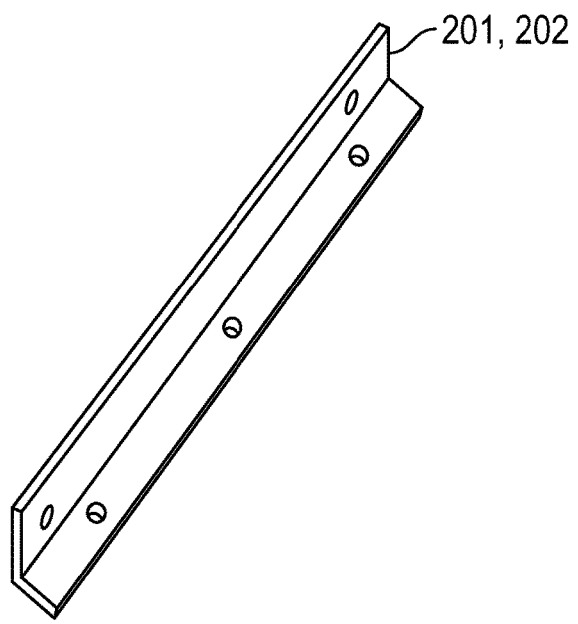
FIG. 4 is a perspective view of a repositionable support bracket for a power distribution base unit in accordance with an embodiment of the present invention.

FIG. 4 shows exemplary repositionable support brackets 201 and/or 202 in greater detail. In one embodiment, the repositionable support brackets 201 and/or 202 each comprise an elongated structural metal beam having an "L-shaped" cross sectional area. In other embodiments the repositionable support brackets 201 and/or 202 may have any polygonal cross-sectional area including but not limited to square, rectangular, triangular, pentagonal, or moreover circular or elliptical cross-sectional areas. Particular cross-sectional areas of the repositionable support brackets 201 and/or 202 may be selected as appropriate to facilitate secure fastening of one or more of the interconnecting structure surfaces. As depicted in FIG. 4, the repositionable support brackets 201 and/or 202 further comprise one or more apertures along at least one face, said apertures may receive removable connecting components such as bolts, screws or pins during removable attachment to the power distribution base unit 200, the welding machine support units and/or other structures. It should be understood that the illustrated lengths and aperture numbers and locations are merely exemplary of one of several possible positions useful to facilitate removable component attachments.

Returning to FIG. 3, a plurality of repositionable support brackets 201 are movably mounted and in the example arrangement depicted, are in parallel independently adjustable spaced positioning towards a proximal end (for example a left end) of the upper horizontal planar surface 203. Additionally, a plurality of repositionable support brackets 202 are movably mounted in the example arrangement depicted and are in parallel independently adjustable spaced positioning towards a distal end (for example a right end) of the upper horizontal planar surface 203. As further shown in FIG. 3, the repositionable support brackets 201, 202 are adjustably spaced along an X axis at independently selected displacements $Xn1$, $Xn2$, $Xn3$, ... $Xn$, etc. where $Xn$ is any decimal or fractional number indicating a distance along an X axis. Therefore, each of the numbers $Xn$ represent a current "gap distance" between adjacent repositionable support brackets 201 and/or 202.

In operation, the gap distances $Xn$ are selected to correspond to at least one external dimension of at least one surface of a welding machine support unit such that the selected gap distances position the repositionable support brackets 201 and/or 202 securely around a perimeter of any surface, for example a bottom surface of a welding machine support unit. As explained elsewhere herein, each different manufacturer of welding equipment and each type and size of welding machine array may have unique dimensions, shapes, and structural requirements for the various welding equipment products, including welding machine support units. By judicious selection of gap distances $Xn$ between the repositionable support brackets 201 and/or 202, each of the power distribution base units 200 may be configured to accommodate any type of welding machine support unit, regardless of manufacturer. Once the gap distances $Xn$ between the repositionable support brackets 201 and/or 202 are properly set as dimensionally appropriate for a particular manufacturers welding machine support units, the repositionable support brackets 201 and 202 are secured in place along the upper horizontal planar surface 203 of the power distribution base units 200 using combinations of connecting components selected from apertures, pins, screws, bolts, clamps, nuts, washers and other connectors as are known in the art to allow rapid, rigid, and structurally sound interconnections between the upper planar surface 203 of each power distribution base units 200 and a bottom surface of a welding machine support unit, such as the various array packs, types, sizes and manufacturers welding machine support units 1000-4000 (see for example in FIG. 10). As discussed elsewhere herein, the mating surfaces illustrated and described as top, bottom, etc. are inclusive of any appropriate mate able surfaces between the power distribution base units 200 and the various welding machine support units 1000-4000 including at least respective front, back, top, bottom, or any left side or right side mount surfaces. As such, the interconnected power distribution base units 200 and welding machine support units form an interoperable power distribution apparatus and system.

Figure 6:
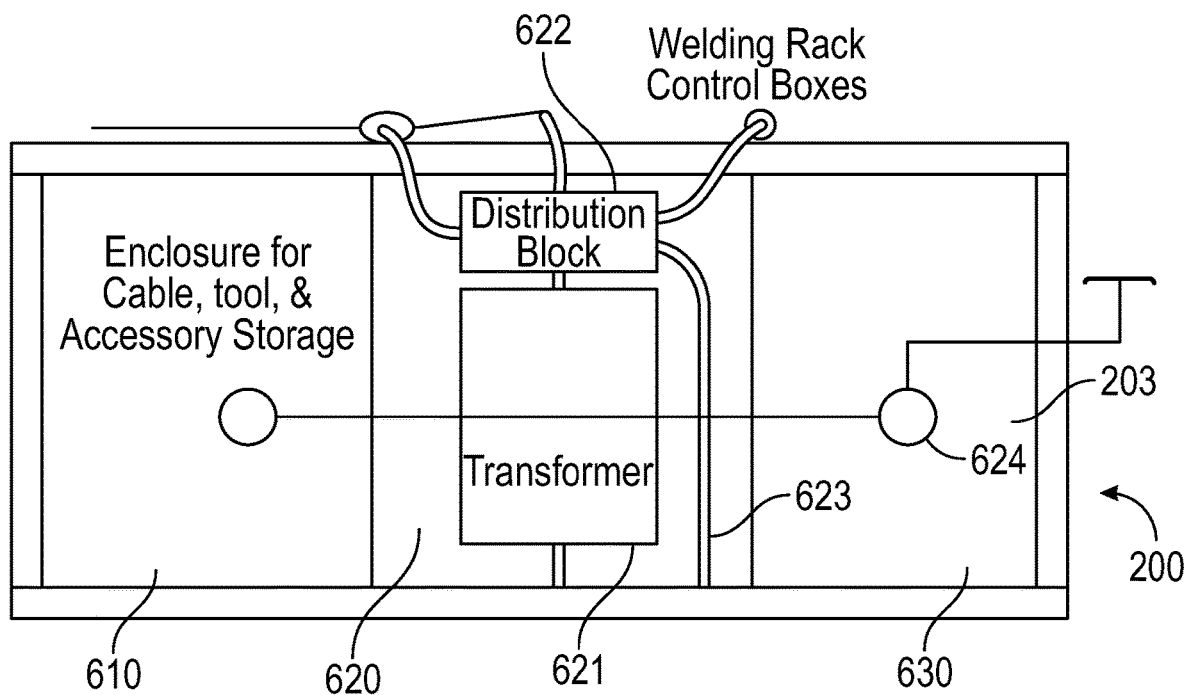
FIG. 6 is another top view of the power distribution base unit shown in FIG. 2 with the repositionable support brackets removed in accordance with an embodiment of the present invention.

FIG. 6 is another top view of the power distribution base unit 200 shown in FIG. 2, in this case having the repositionable support brackets 201 and 202 removed for clarity of explanation and allowing components below the repositionable support brackets 201 and 202 within the power distribution base unit 200 to be viewed. FIG. 6 shows three representative enclosure compartment areas 610, 620, and 630, although more or less compartment areas may be employed. In an exemplary embodiment, a first compartment area 610 may be available for storage of accessories, tools, spare cable, or any other items useable by work crew members at a worksite. A second compartment area 620 includes electrical devices such as at least one transformer 621, at least one power distribution block 622, and various electrical wiring runs 623. A third compartment area 630 may provide additional spare storage or house additional components. Each of the representative compartment areas 610, 620, and 630 may further include penetrations, conduit, or raceways 624 to accommodate, organize, and protect various additional electrical wiring runs 623. Said electrical wiring runs 623 are integrated for electrical interconnections between a plurality of N welding machine units, control boxes, power tools, luminaires, electrical receptacles, or other electrical devices which may be selectively powered using a unified electrical power input.

Still referring to FIG. 6, the at least one transformer 621 is configured to allow for voltage transformations between windings (such as step-up/step-down, increases or decreases) and/or circuit isolation in a manner as is known to those of ordinary skill in the art. The at least one transformer 621 may include primary, secondary and tertiary windings, internal fixed or variable taps having tap changers, as well as relative winding turn ratios which facilitate a wide range of voltage conversions as needed by welding machines which are produced by different manufacturers, for use with electrical supply nominal voltages available in different countries around the world, and for different types of welding machine array packs arranged in series or parallel configurations. The at least one power distribution block 622 receives and distributes the various power voltage levels and further provides a plurality of electrical connectivity points between the at least one transformer 621 and the load devices being serviced. The at least one power distribution block 622 may additionally provide wired or wireless interconnections between other circuits such as, for example, communications circuits and safety monitoring circuits, whether locally or for remote monitoring. Although not shown in the figure, other power conditioning components may be included within the at least one power distribution block 622 or electrically interconnected and physically external to it. Examples of other power conditioning components include voltage regulation and smoothing systems, voltage conversion systems (including AC/DC conversions), wave shaping systems which optimize waveforms within a power cycle feeding specific loads, spike and lightning suppression systems, backup power systems, current inrush limiters, computer controlled and programmable systems, and other protective systems which may be controlled by artificial intelligence and are known in the art. Therefore, the instant power distribution apparatus and system is also electrically interoperable in view of the foregoing electrical adaptability between welding machines and equipment which are produced by different manufacturers and designed for operation at the nominal supply voltages available in different countries around the world regardless of specific type, voltage, current and power requirements which are indicated by the manufacturers of welding machine array packs.

Figure 7:
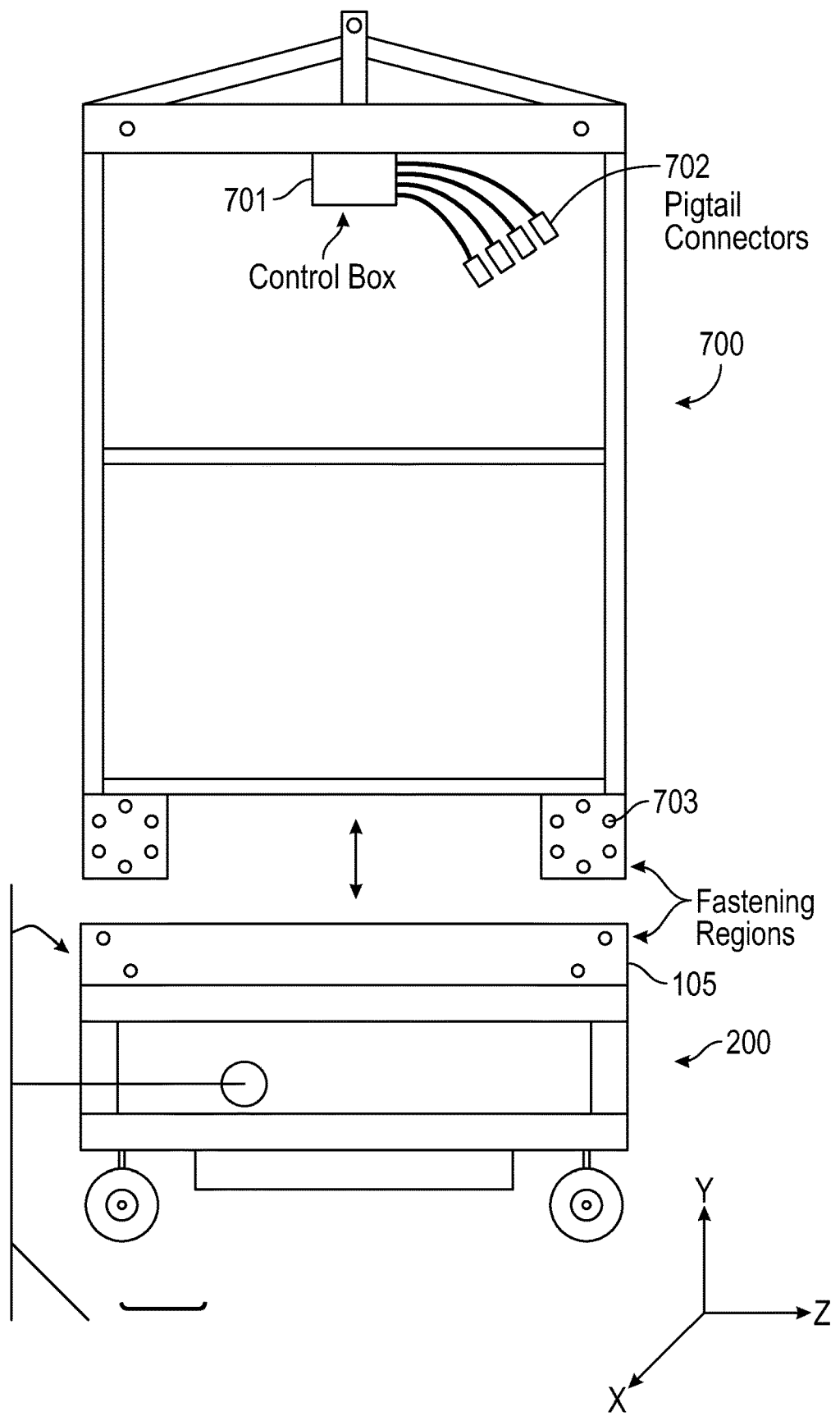
FIG. 7 is a side view of a welding machine support unit frame attachable to a power distribution base unit in a second configuration in accordance with an exemplary alternate embodiment of the present invention.

FIG. 7 shows a side view of a welding machine support unit frame 700 which is attachable to a power distribution base unit 200 in a second configuration in accordance with an exemplary alternate embodiment of the present invention. FIG. 7 shows a welding machine support unit frame 700 which is particularly adapted for interoperability when connected to a power distribution base unit 200 to form an alternate embodiment of an interoperable power distribution system. The welding machine support unit frame 700 supports welding machines produced by various manufacturers and includes at least the following aspects: First, the welding machine support unit 700 frame structure includes a plurality of fastening regions 703 arranged along a lower portion of the frame. The plurality of fastening regions 703 are positioned for mating engagement with another set of a plurality of fastening regions 105 which are positioned along a portion, in one example an upper portion of a power distribution base unit 200. Said mating engagement may be achieved using removably attached combinations of connecting components such as apertures, pins, screws, bolts, clamps, nuts, washers and other connectors as are known in the art. Notably, the plurality of fastening regions 703 are likewise positioned to allow for mating engagement with another set of a plurality of fastening regions 703 which are positioned along a lower portion of a second welding machine support unit frame 700 which may be positioned, for example, adjacent and left of the center welding machine support unit 700 frame, as well as a third welding machine support unit frame 700 which may be positioned, for example, adjacent and right of the center welding machine support unit 700 frame. In this embodiment, each of welding machine support unit frames 700 may be mechanically connected along an X axis using removably attachable combinations of connecting components such as apertures, pins, screws, bolts, clamps, nuts, washers and other connectors as are known in the art, and each may be similarly mechanically connected along a Y axis to a corresponding power distribution base unit 200 positioned below each of the respective welding machine support unit frames 700 for removably attachable mechanical connections of sufficient rigidity to allow full weight bearing capacity of large arrays of various welding machine support unit frames integrated along the X and Y axes to create customizable arrays of structurally, interconnected, yet fully disconnectable components suitable for any size welding projects, allowing for well-organized and simultaneous use of a great number of welding machines which may be safely stacked and integrated into a unified super system.

Second, referring again to FIG. 7, the welding machine support unit 700 frame structure includes a control box 701. The welding machine support unit 700 frame structure may further include a plurality of pigtail type connectors 702. The welding machine support unit 700 frame structure may still further include one or more remote mounted outlet boxes. The one or more remote mounted outlet boxes comprises an electrical box having electrical receptacles and electrical power output connectors which may removably mounted at various positions and convenient heights along the frame of the welding machine support unit 700 frame structure for universal attachment and temporary or permanent mounting to the welding machine support unit 700 frame structure. The one or more remote mounted outlet boxes may be electrically connected by wiring into a power distribution block, such as for example the at least one power distribution block 622 of the power distribution base unit 200. In one embodiment the one or more remote mounted outlet boxes may be mounted for securement to any one of the elongated beams extending along an X axis, a Y axis, or a Z axis directions of the welding machine support unit 700 frame structure. In another embodiment the one or more remote mounted outlet boxes may be mounted for securement between opposing sets of elongated beams extending along an X axis, a Y axis, or a Z axis directions of the welding machine support unit 700 frame structure. Therefore, the instant welding machine support unit 700 frame structure having a control box 701, a plurality of pigtail type connectors 702 and/or one or more remote mounted outlet boxes facilitates rapid and conveniently positioned electrical connections of each of the electrical devices which may be integrated with the interoperable power distribution system.

Third, referring again to FIG. 7, as the welding machine support unit 700 frame including the plurality of fastening regions 703 and the plurality of pigtail type connectors 702, is constructed for mating engagement with a corresponding power distribution base unit 200, the instant welding machine support unit 700 frame and the power distribution base unit 200 may be manufactured by a single manufacturer in various sizes having coordinated dimensions such that the combined system of FIG. 7 is both mechanically and electrically interoperable as an alternate embodiment of a unified welding system.

Figure 8:
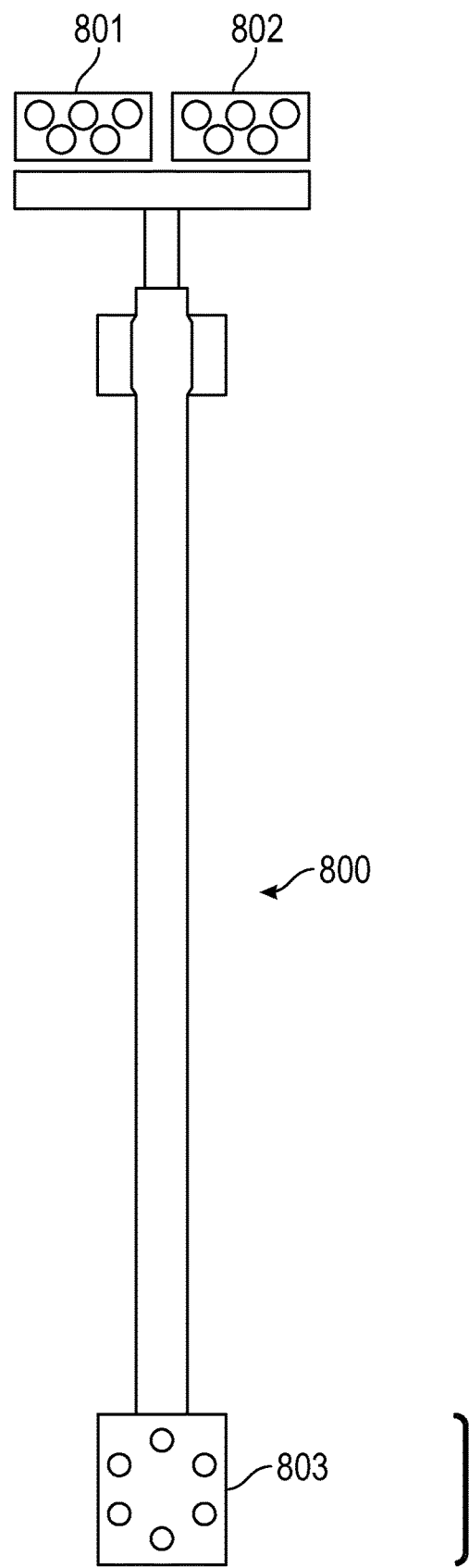
FIG. 8 is a perspective view of a light mast unit in accordance with an embodiment of the present invention.

FIG. 8 shows one example of a light mast unit 800 which may be used along with any of the various welding machine support units and the power distribution base unit embodiments disclosed herein. As used herein, a light mast unit 800 comprises one or a plurality of single and multistage light masts. In one illustrated embodiment as shown in FIG. 8 along a top portion, one or more luminaires 801 and 802 are removably electrically and mechanically connected to a light mast unit 800. As further shown in FIG. 8 along a bottom portion, one or more fastening regions 803 may include combinations of connecting components such as apertures, pins, screws, bolts, clamps, nuts, washers and other connectors as are known in the art which may be used to removably attach said light mast units 800 to power distribution base units 200, or any of the welding machine support units disclosed herein. Although an elongated beam type light mast unit 800 is depicted in the FIG. 8, other types of luminaires such as magnetically attachable canopy lights may also be employed additionally or alternatively.

Figure 9:
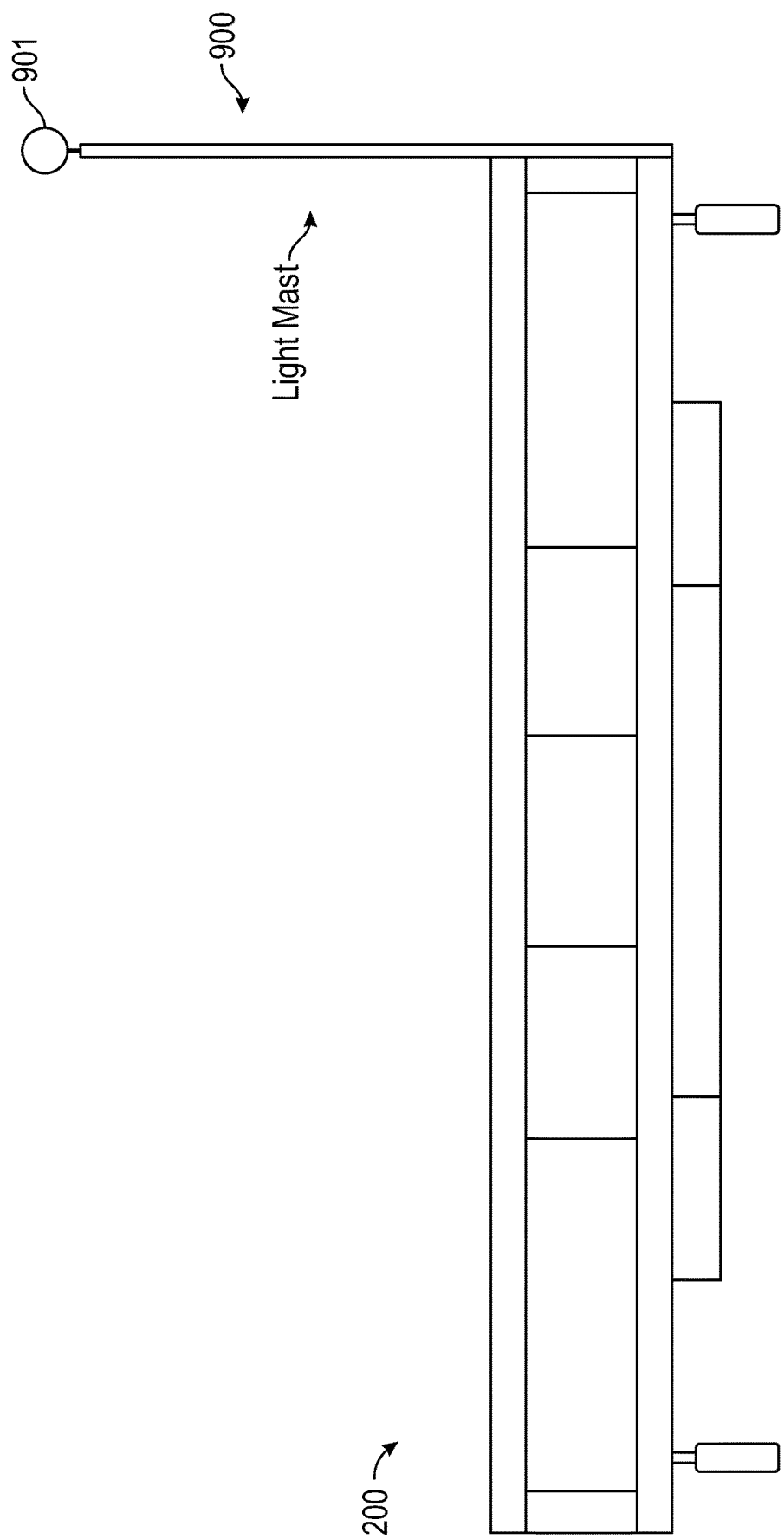
FIG. 9 is a perspective view of another light mast unit attached to a power distribution base unit in accordance with an embodiment of the present invention.

FIG. 9 shows another representative example of yet another type of light mast unit 900 having one or more luminaires 901, which is shown as removably attached along a fastening region (which is similar to those disclosed elsewhere herein) to a power distribution base unit 200 in accordance with an embodiment.

Figure 11:
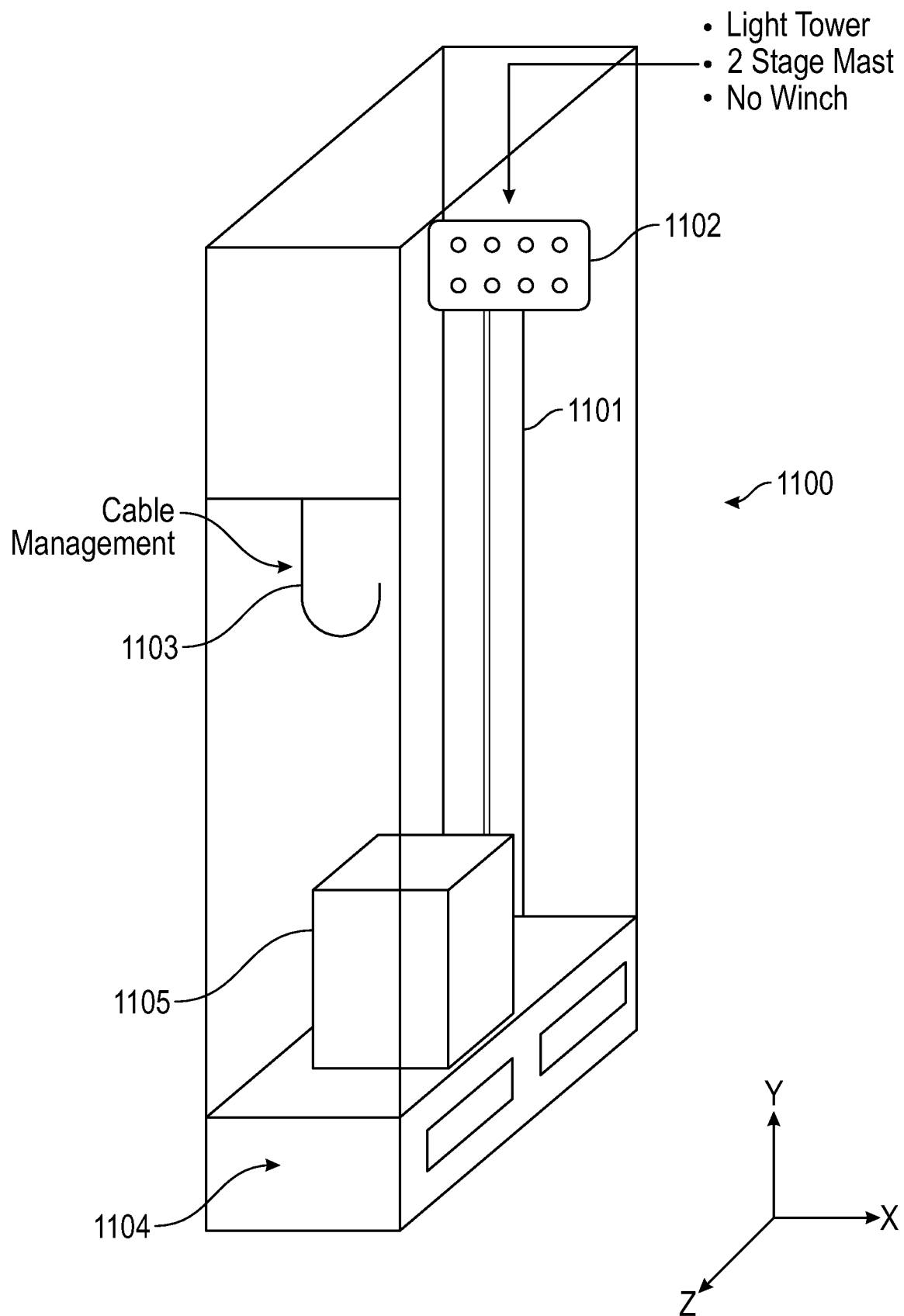
FIG. 11 is a perspective view of a welding machine support unit frame having a third configuration in accordance with an exemplary embodiment of the present invention.

FIG. 11 is a perspective view of a welding machine support unit frame 1100 having a base portion 1104 in a third configuration in accordance with yet another exemplary embodiment. In this embodiment depicted in FIG. 11, the form factor of both the welding machine support unit frame 1100 and the base portion 1104 are elongated or truncated along any of the X, Y, or Z axis dimensions to produce a welding machine support unit having a non-standard form which may support various configurations of welding machines 1105. Moreover, along with the adapted form factor, an upper hook like projection 1103 is used as an alternate cable management component wherein cables may be wrapped around the hook like projection 1103. This embodiment further depicts in FIG. 11 additional luminaires such as the light tower unit 1101 having a two-stage mast and various lamp fixtures 1102. Although no winch is required in the illustrated example of FIG. 11, other embodiments may include a winch where appropriate. The welding machine support unit frame 1100 of this embodiment may be removably attached to power distribution base units 200 described in previous embodiments.

While the present invention has been illustrated by the description of exemplary embodiments thereof, and while the embodiments have been described in certain detail, there is no intention to restrict or in any way limit the scope of the appended claims to such detail. Additional advantages and modifications will readily appear to those skilled in the art. Therefore, the invention in its broader aspects is not limited to any of the specific details, representative devices and methods, and/or illustrative examples shown and described. Accordingly, departures may be made from such details without departing from the spirit or scope of the general inventive concept.

The invention claimed is:

1. An interoperable power distribution apparatus comprising:
    N power distribution base units, said N power distribution base units having:
        a first configuration wherein said N power distribution base units are each configured to be sequentially arranged along at least a first direction with at least another of said N power distribution base units such that said N power distribution base units when sequentially arranged along said at least said first direction are secured in sequence and removably attached; and
        a second configuration wherein said N power distribution base units are not configured to be secured in sequence along said at least said first direction, each of said N power distribution base units are independently and removably attached to at least one of front, back, top, bottom or side mount surfaces of a respective one of N welding machine support units, each of said N welding machine support units having equal or unequal external first, second, or third orthogonal dimensions, each of said N power distribution base units interoperable between any of said N welding machine support units,
    wherein N is a positive natural number between 1 and 100.

2. The interoperable power distribution apparatus of claim 1 wherein said N power distribution base units each further comprise a plurality of repositionable support brackets arranged along a surface of said N power distribution base units, said plurality of repositionable support brackets configured for positioning, movement, and secure repositioning of said plurality of repositionable support brackets for interoperability between said N welding machine support units constructed with said equal or unequal external first, second, or third orthogonal dimensions to accommodate removable attachment to a variety of types of said N welding machine support units.

3. The interoperable power distribution apparatus of claim 2 wherein said N power distribution base units each further comprise one or more transformers electrically connectable to one or more power distribution blocks.

4. The interoperable power distribution apparatus of claim 2 wherein said N power distribution base units each further comprise one or more removably attached light mast units each electrically connectable to one or more luminaires.

5. The interoperable power distribution apparatus of claim 2 wherein said N power distribution base units each further comprise one or more magnetically attachable canopy lights.

6. The interoperable power distribution apparatus of claim 2 wherein said N power distribution base units each further comprise one or more fork pockets configured to receive a plurality of forklift prongs.

7. The interoperable power distribution apparatus of claim 2 wherein said N power distribution base units each further comprise one or more enclosure compartments configured for storage of at least one of cables, work tools, work materials, work parts, or work accessories.

8. The interoperable power distribution apparatus of claim 2 wherein said N power distribution base units each further comprise a plurality of casters, rollers, or wheels.

9. The interoperable power distribution apparatus of claim 2 wherein said N power distribution base units each further comprise a plurality of fastening regions for removable attachment of at least another of said N power distribution base units using components selected from a group consisting of apertures, pins, screws, bolts, clamps, nuts, and washers.

10. The interoperable power distribution apparatus of claim 2 wherein said N power distribution base units each further comprise integrated, interconnecting electrical wiring wherein a plurality of welding machine devices, control boxes, power tools, luminaires, electrical receptacles, or other electrical devices are selectively powered using a unified electrical power input.

11. An interoperable power distribution system comprising:
N welding machine support units each comprising a frame structure configured to support at least one welding machine device, each frame structure comprising a plurality of fastening regions for removable attachment of each frame structure to at least another of said frame structure; and
N power distribution base units, said N power distribution base units having:
a first configuration wherein said N power distribution base units are each configured to be sequentially arranged along at least a first direction with at least another of said N power distribution base units such that said N power distribution base units when sequentially arranged along said at least said first direction are secured in sequence and removably attached; and
a second configuration wherein said N power distribution base units are not configured to be secured in sequence along said at least said first direction, each of said N power distribution base units are independently and removably attached to at least one of front, back, top, bottom or side mount surfaces of a respective one of said N welding machine support units along at least one of said fastening regions, each of said N welding machine support units having equal or unequal external first, second, or third orthogonal dimensions, each of said N power distribution base units interoperable between any of said N welding machine support units having equal or unequal external first, second, or orthogonal third dimensions,
wherein N is a positive natural number between 1 and 100.

12. The interoperable power distribution system of claim 11 wherein said N power distribution base units each further comprise a plurality of repositionable support brackets arranged along a surface of said N power distribution base units, said plurality of repositionable support brackets configured for positioning, movement, and secure repositioning of said plurality of repositionable support brackets for interoperability between said N welding machine support units constructed with equal or unequal external first, second, or third orthogonal dimensions to accommodate removable attachment to a variety of types of N welding machine support units.

13. The interoperable power distribution system of claim 12 wherein each frame structure of said N welding machine support unit further comprises a plurality of elongated beams and shelves arranged to support said at least one welding machine device.

14. The interoperable power distribution system of claim 12 wherein each frame structure of said N welding machine support unit further comprises a plurality of fastening regions for removable attachment of said frame structure to at least another of said frame structure or at least one of said N power distribution base units, said fastening regions including components selected from a group consisting of apertures, pins, screws, bolts, clamps, nuts, and washers.

15. The interoperable power distribution system of claim 12 wherein said N power distribution base units each further comprise one or more transformers electrically connectable to one or more power distribution blocks.

16. The interoperable power distribution system of claim 12 wherein said N power distribution base units each further comprise at least one of one or more removably attached light mast units each electrically connectable to one or more luminaires and one or more magnetically attachable canopy lights.

17. The interoperable power distribution system of claim 12 wherein said N power distribution base units each further comprise one or more fork pockets configured to receive a plurality of forklift prongs.

18. The interoperable power distribution system of claim 12 wherein said N power distribution base units each further comprise one or more enclosure compartments configured for storage of at least one of cables, work tools, work materials, work parts, or work accessories.

19. The interoperable power distribution system of claim 12 wherein said N power distribution base units each further comprise integrated, interconnecting electrical wiring wherein a plurality of said at least one welding machine device, control boxes, power tools, luminaires, electrical receptacles, or other electrical devices are selectively powered using a unified electrical power input.

20. The interoperable power distribution system of claim 12 wherein said N welding machine support units each comprise one or more pigtail type connectors, one or more remote mounted outlet boxes, or both said one or more pigtail type connectors and said one or more remote mounted outlet boxes.

* * * * *